(12) United States Patent
Chiue et al.

(10) Patent No.: US 12,550,767 B2
(45) Date of Patent: Feb. 10, 2026

(54) PACKAGE SUBSTRATE AND FABRICATING METHOD THEREOF

(71) Applicant: AaltoSemi Inc., Suzhou (CN)

(72) Inventors: Jiun-Hua Chiue, Suzhou (CN); Yin-Ju Chen, Suzhou (CN); Yi-Wen Liu, Suzhou (CN); Min-Yao Chen, Suzhou (CN); Andrew C. Chang, Suzhou (CN)

(73) Assignee: AaltoSemi Inc., Jiangsu (CN)

( * ) Notice: Subject to any disclaimer, the term of this patent is extended or adjusted under 35 U.S.C. 154(b) by 0 days.

(21) Appl. No.: 18/829,866

(22) Filed: Sep. 10, 2024

(65) Prior Publication Data
US 2025/0087567 A1  Mar. 13, 2025

(30) Foreign Application Priority Data
Sep. 11, 2023  (CN) .......................... 202311162198.9

(51) Int. Cl.
  *H01L 21/48*  (2006.01)
  *H01L 23/498*  (2006.01)
(52) U.S. Cl.
  CPC .... *H01L 23/49822* (2013.01); *H01L 21/4857* (2013.01)

(58) Field of Classification Search
  CPC .......... H01L 23/49822; H01L 21/4857; H01L 23/49816; H01L 23/49811; H01L 21/4853; H01L 23/49838; H05K 2201/0376
  See application file for complete search history.

(56) References Cited

U.S. PATENT DOCUMENTS

| | | | |
|---|---|---|---|
| 4,985,601 A * | 1/1991 | Hagner | H05K 1/183 174/262 |
| 2006/0191715 A1* | 8/2006 | Koyama | H05K 3/4069 174/262 |
| 2016/0163632 A1* | 6/2016 | Chen | H01L 21/486 438/126 |
| 2018/0233454 A1* | 8/2018 | Kim | H01L 24/19 |

FOREIGN PATENT DOCUMENTS

TW      201106455 A     2/2011

* cited by examiner

*Primary Examiner* — Timothy J Thompson
*Assistant Examiner* — Aditya Sharma
(74) *Attorney, Agent, or Firm* — Jose Cherson Weissbrot

(57) ABSTRACT

A package substrate is provided, in which a thinner second dielectric layer is formed on one side of a circuit structure including a first dielectric layer, so as to prevent large stress difference between two opposite sides of the circuit structure, thereby preventing the package substrate from warpage problems. A method of fabricating the package substrate is also provided.

2 Claims, 5 Drawing Sheets

PACKAGE SUBSTRATE AND FABRICATING METHOD THEREOF

BACKGROUND

1. Technical Field

The present disclosure relates to a semiconductor packaging process, and more particularly, to a package substrate and a manufacturing method thereof for preventing warping during the process.

2. Description of Related Art

With the booming development of the electronics industry, electronic products tend to be light, thin, short and small in form, while in function they are developing toward high performance, high functionality, and high speed.

There are many technologies currently applied in the field of chip packaging, for example, flip-chip package modules such as chip scale package (CSP), direct chip attach (DCA), and multi-chip module (MCM), or chip stacking technology that stacks chips in three dimensions for integration into a three-dimensional integrated circuit (3D IC).

FIG. 1 is a schematic cross-sectional view of a semiconductor package 1 of a conventional three-dimensional (3D) integrated circuit (IC) chip stack. As shown in FIG. 1, a manufacturing method of the semiconductor package 1 is to first provide a through-silicon interposer (TSI) 10, wherein the through-silicon interposer 10 has a chip mounting side 10a, an external connection side 10b opposing the chip mounting side 10a, and a plurality of conductive through-silicon vias (TSVs) 100 connecting the chip mounting side 10a and the external connection side 10b, and a redistribution layer (RDL) 12 is formed on the chip mounting side 10a and is electrically connected to the conductive through-silicon vias 100. Next, a semiconductor chip 11 is electrically bonded to the redistribution layer 12 through electrode pads 110 thereon via a plurality of solder bumps 111, and an underfill 112 is filled between the semiconductor chip 11 and the through-silicon interposer 10 to cover the solder bumps 111, and then an encapsulant 14 is formed on the through-silicon interposer 10 to encapsulate the semiconductor chip 11 and the underfill 112. Thereafter, a package substrate 1a is electrically bonded to the conductive through-silicon vias 100 through solder pads 160 thereon via a plurality of conductive bumps 16 of controlled collapse chip connection (C4) specification, and another underfill 17 is filled between the through-silicon interposer 10 and the package substrate 1a to cover the conductive bumps 16. Finally, a plurality of solder balls 19 are connected to a bottom side of the package substrate 1a for external connection of a circuit board (not shown).

However, in the conventional semiconductor package 1, the package substrate 1a is made of an organic material and has a core layer and a dielectric layer, and the coefficient of thermal expansion (CTE) of the package substrate 1a is mismatched with the CTE of the through-silicon interposer 10. Thus, uneven thermal stress is prone to occur, resulting in a significant warpage of the package substrate 1a during the thermal cycle, which may cause reliability problems such as poor soldering (i.e., dropping of the solder balls 19), non-wetting of the solder balls 19, or cracking of the package substrate 1a.

Therefore, how to overcome the problems of the prior art mentioned above has become an urgent issue to be solved.

SUMMARY

In view of various shortcomings of the prior art mentioned above, the present disclosure provides a package substrate, which comprises: a circuit structure having a first side and a second side opposing the first side, wherein the circuit structure includes at least a first dielectric layer and a circuit layer formed on the first dielectric layer; a second dielectric layer formed on the first side of the circuit structure, wherein a thickness of the second dielectric layer is less than a thickness of the first dielectric layer; and a plurality of conductors embedded in the second dielectric layer and electrically connected to the circuit layer on the first side of the circuit structure.

The present disclosure also provides a method of fabricating a package substrate, the method comprises: forming a coreless type circuit structure on each of two opposite sides of a carrier, wherein the circuit structure has a first side and a second side opposing the first side, and the circuit structure is formed on the carrier via the first side thereof, and the circuit structure includes at least a first dielectric layer and a circuit layer formed on the first dielectric layer; removing the carrier to obtain a plurality of the circuit structures; disposing the plurality of circuit structures on two opposite sides of a support member via the second sides thereof, and having the first side of each of the plurality of circuit structures face outward; forming a second dielectric layer on the first side of each of the plurality of circuit structures to form a circuit board; removing the support member to obtain a plurality of the circuit boards; and forming a plurality of conductors in the second dielectric layer, wherein the conductors are electrically connected to the circuit layer.

In the foregoing package substrate and method, the circuit layer on the first side of the circuit structure is embedded in the first dielectric layer on the first side of the circuit structure.

In the foregoing package substrate and method, the circuit layer on the first side of the circuit structure is recessed into a surface of the first dielectric layer on the first side of the circuit structure to form a plurality of grooves, and the conductors are disposed in the grooves.

In the foregoing package substrate and method, the first dielectric layer and the second dielectric layer are made of the same material.

In the foregoing package substrate and method, the present disclosure further comprises forming an insulating protective layer on the second dielectric layer, wherein a plurality of openings for exposing the conductors are formed in the insulating protective layer, and conductive elements are disposed in the openings and bonded to the conductors.

As may be seen from the above, the package substrate and fabricating method thereof of the present disclosure mainly utilizes different thicknesses of layers (i.e., the first dielectric layer and the second dielectric layer) of the package substrate to distribute stress, and prevent large stress difference between the first side and the second side of the circuit structure, thereby preventing the package substrate from warpage problems. Therefore, comparing to the prior art, when the package substrate undergoes multiple manufacturing processes with environmental temperature variation, deformation and warpage can be effectively prevented from occurring to the package substrate, and problems such as detachment or crack can be prevented from occurring to the conductive elements.

DETAILED DESCRIPTION

Figure 1:
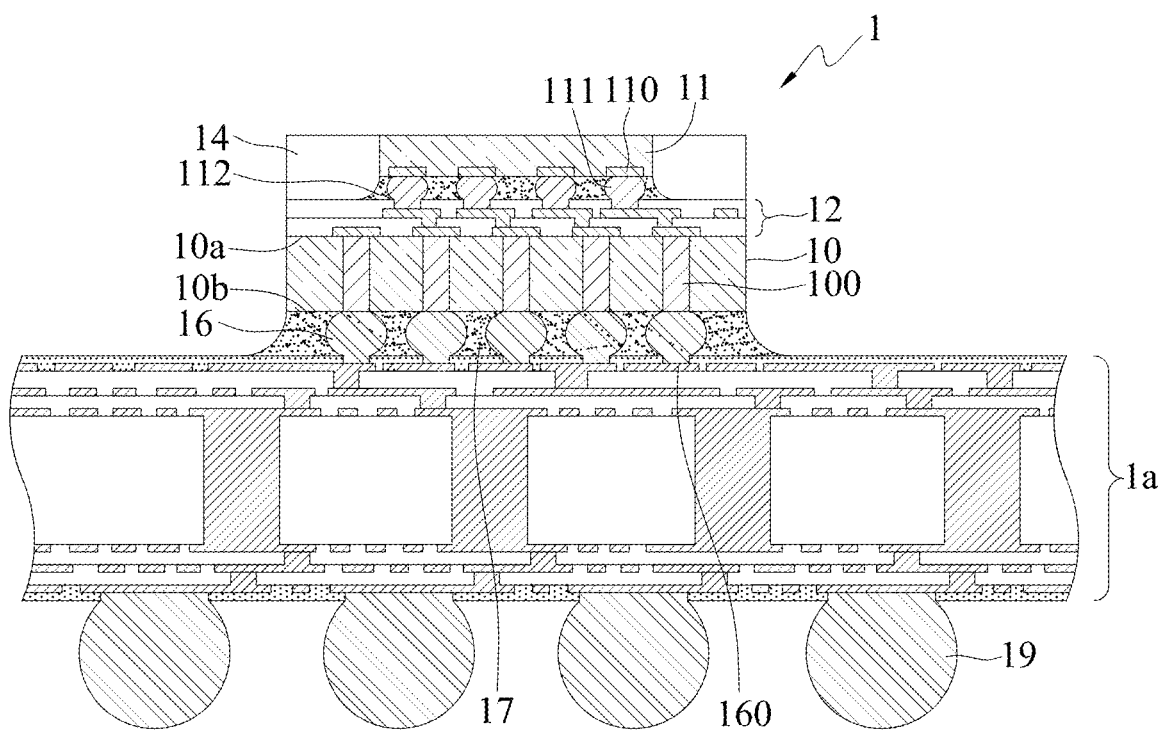
FIG. 1 is a schematic cross-sectional view of a conventional semiconductor package.

Implementations of the present disclosure are illustrated below by embodiments. Those skilled in the art may easily understand other advantages and effects of the present disclosure from the content disclosed in this specification.

It should be noted that the structures, proportions, sizes, etc. depicted in the drawings appended to this specification are only used in coordination with the content disclosed in the specification for those skilled in the art to understand and read. They are not used to limit specific condition of implementing this disclosure, and therefore have no substantial technical meaning. Without affecting the effects created and the purposes achieved by this disclosure, any modification, change, or adjustments in structures, proportions, or sizes shall still fall within the scope of the technical content disclosed herein. Meanwhile, terms such as "on," "first," "second," "one," "a," and the like cited in this specification are only for illustrating clearly and are not used to limit the implementable scope of the present disclosure. Without substantial change in the technical content, changes or adjustments of their relative relationships shall also be regarded as within the implementable scope of the present disclosure.

FIG. 2A to FIG. 2H are schematic cross-sectional views illustrating a fabricating method of a package substrate 2 of the present disclosure.

Figure 2A:
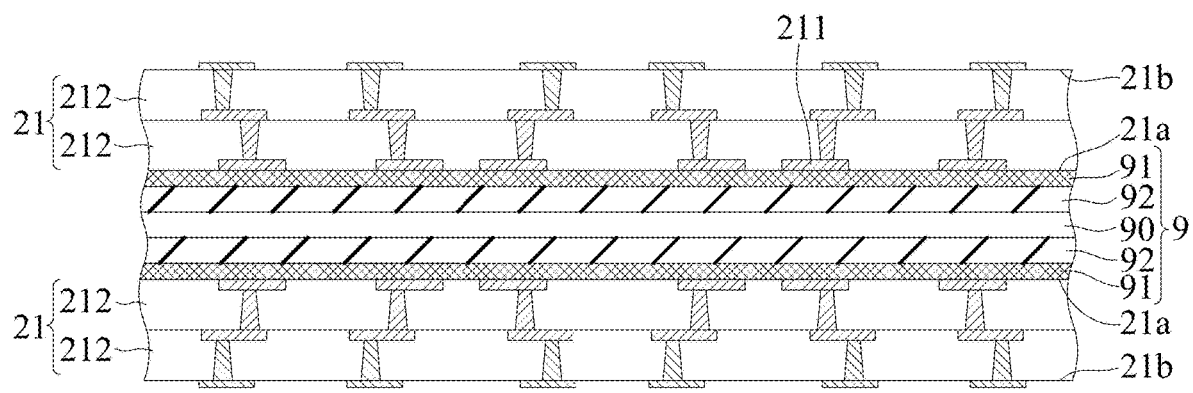
FIG. 2A to FIG. 2H are schematic cross-sectional views illustrating a fabricating method of a package substrate of the present disclosure.

As shown in FIG. 2A, a carrier 9 is provided, and circuit structures 21 are formed symmetrically on two opposite sides of the carrier 9.

In an embodiment, the carrier 9 is a temporary carrier board, which may be a board with metal layers 91 on two opposite sides. For example, a detach layer 92 is formed on each of two opposite surfaces of a board 90 such as a thermal release film, and a metal layer 91 is formed on each of the detach layers 92 to form the circuit structures 21 on the metal layers 91.

Furthermore, each of the circuit structures 21 is coreless and is defined as each having a first side 21a and a second side 21b opposing the first side 21a, and each of the circuit structures 21 is bonded onto the metal layer 91 via the first side 21a thereof.

In addition, the circuit structure 21 comprises a plurality of first dielectric layers 212 and a plurality of circuit layers 211 formed on each of the first dielectric layers 212, and a portion of the circuit layers 211 of the circuit structure 21 is exposed from the first dielectric layer 212 on the second side 21b. For example, the circuit layers 211 utilize a redistribution layer (RDL) specification, and the first dielectric layers 212 are made of polybenzoxazole (PBO), polyimide (PI), prepreg (PP) having glass fiber, or other dielectric materials.

Moreover, the circuit layers 211 are fabricated by electroplating metal (such as copper) or other methods utilizing build-up process. It should be understood that by utilizing build-up process, the number of layers of the first dielectric layers 212 of the circuit structures 21 may be designed depending on requirement to fabricate required number of layers of the circuit layers 211.

Figure 2B:
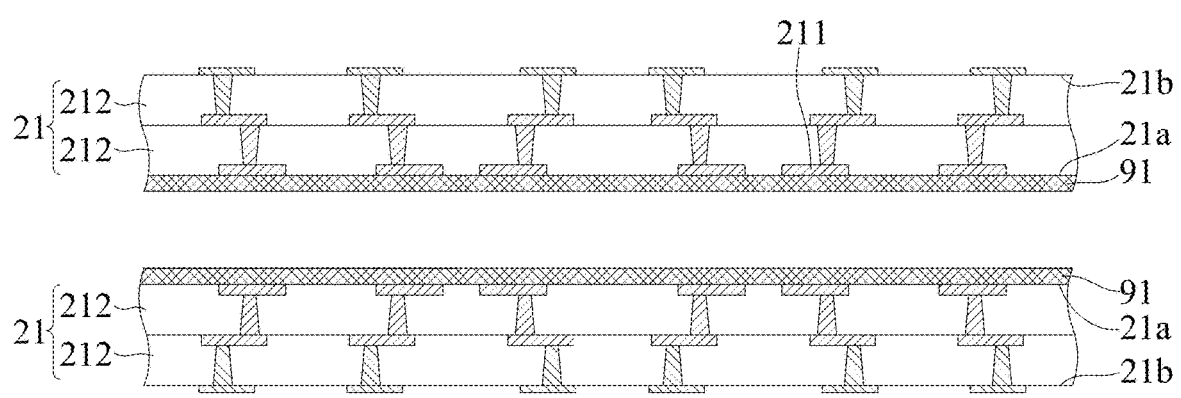

As shown in FIG. 2B, the carrier 9 is detached via the detach layers 92, and the metal layers 91 are exposed. For example, by heating the circuit structures 21 attached to the carrier 9 to the dissociation temperature of the thermal release film (the board 90), the circuit structures 21 on two opposite sides of the board 90 can be detached.

Figure 2C:
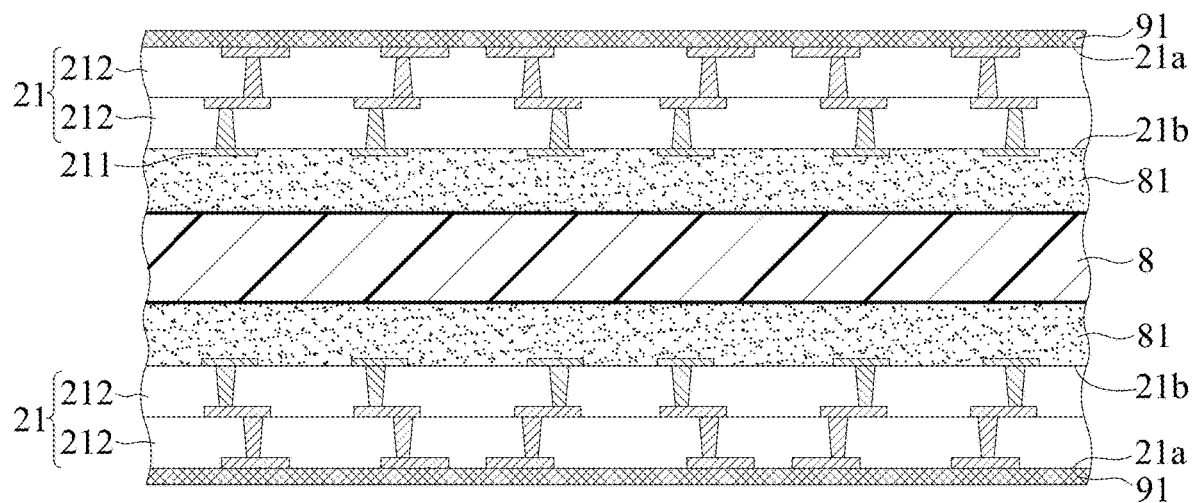
Figure 2D:
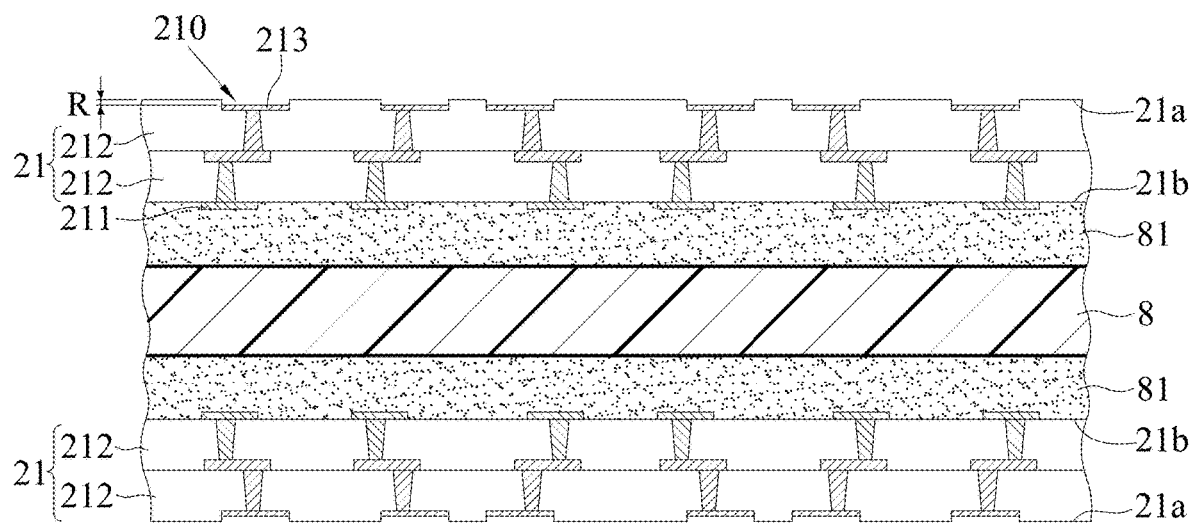

As shown in FIG. 2C, the circuit structures 21 are bonded to two opposite sides of a support member 8 symmetrically. Next, as shown in FIG. 2D, the metal layers 91 are removed.

In an embodiment, the support member 8 is a thermal release film, and the circuit structures 21 are laminated onto the support member 8 via their respective second side 21b, and each of the first sides 21a of the circuit structures 21 faces outward. For example, each of the second sides 21b of the circuit structures 21 is laminated onto the support member 8 via a detach layer 81, wherein the detach layer 81 is a dielectric layer, and the detach layer 81 covers the circuit layer 211 on the second side 21b. The circuit layer 211 on each of the second sides 21b is embedded in each of the detach layers 81, and the circuit layer 211 on each of the first sides 21a of the circuit structures 21 faces outward.

Furthermore, the metal layers 91 are removed by etching, thus the circuit layer 211 on each of the first sides 21a of the circuit structures 21 is etched slightly, so that the circuit layer 213 on each of the first sides 21a of the circuit structures 21 is recessed into the first dielectric layer 212 on each of the first sides 21a of the circuit structures 21, and a plurality of grooves 210 exposing the circuit layer 213 are formed in the first dielectric layer 212 on each of the first sides 21a of the circuit structures 21. For example, a depth R of the grooves 210 is less than about 0.5 microns.

Figure 2E:
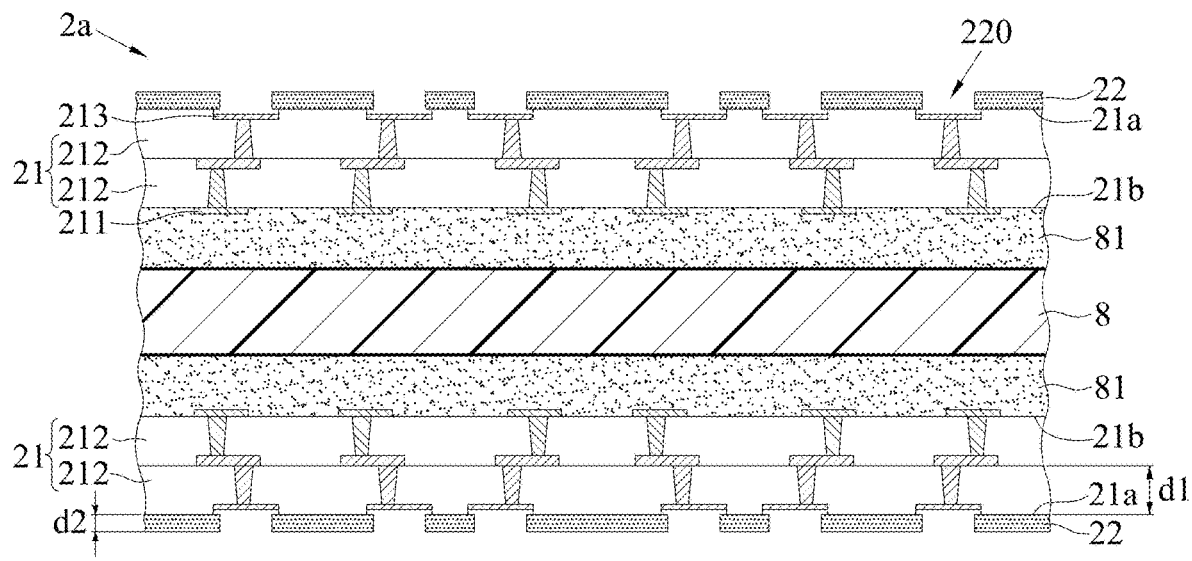

As shown in FIG. 2E, a second dielectric layer 22 is formed on the first dielectric layer 212 on each of the first sides 21a of the circuit structures 21 to form circuit boards 2a.

In an embodiment, a plurality of blind vias 220 are formed on each of the second dielectric layers 22 by such as laser and penetrate through each of the second dielectric layers 22, so that the circuit layer 213 of each of the first sides 21a of the circuit boards 2a is exposed from the blind vias 220.

Furthermore, a thickness d2 of the second dielectric layer 22 (low content of glass fiber) is less than a thickness d1 of the first dielectric layer 212 (high content of glass fiber), so that the blind vias 220 can be formed.

In addition, the second dielectric layer 22 is made of polybenzoxazole (PBO), polyimide (PI), prepreg (PP) having glass fiber, or other dielectric materials. It should be understood that the first dielectric layer 212 and the second dielectric layer 22 may be made of the same or different materials.

Figure 2F:
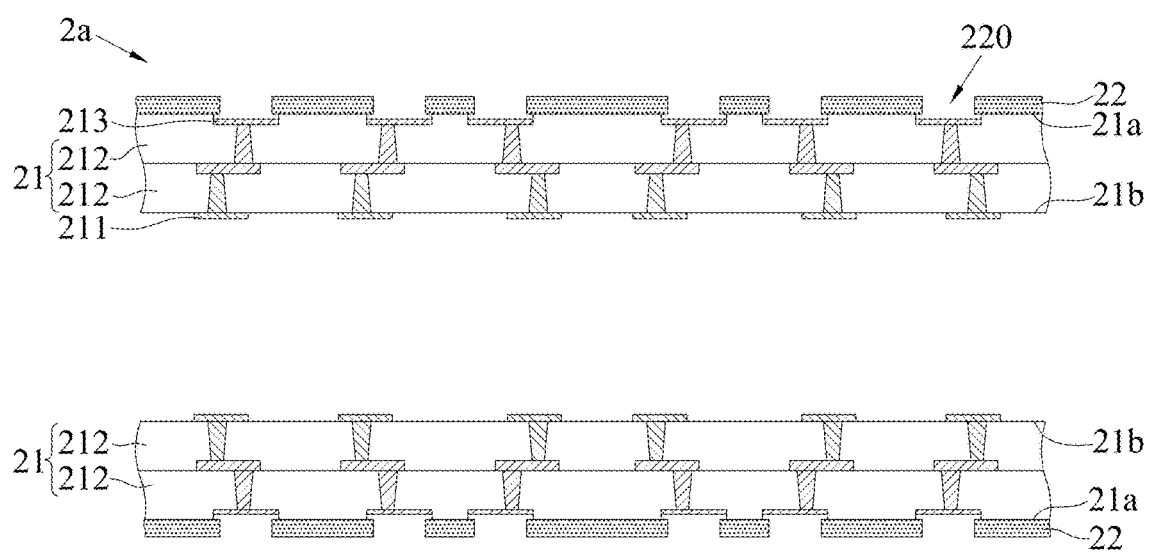

As shown in FIG. 2F, the support member 8 is heated to detach the support member 8 from the circuit boards 2a via the detach layers 81.

Figure 2G:
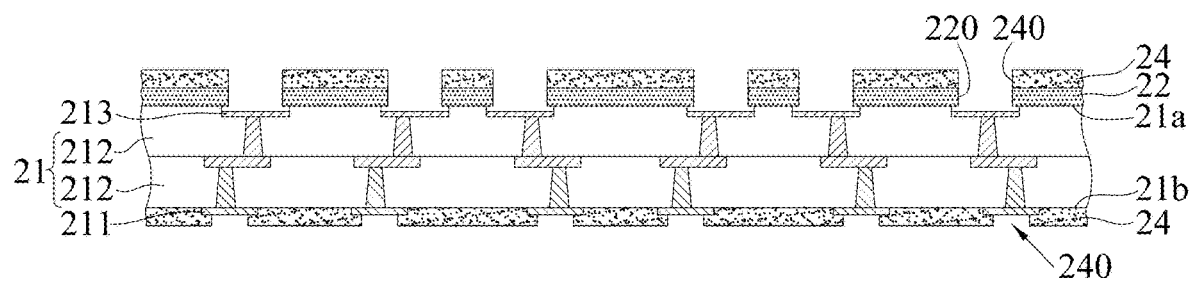

As shown in FIG. 2G, an insulating protective layer 24 made of such as a solder-resist material is formed on the first side 21a and the second side 21b of the circuit board 2a.

In an embodiment, each of the insulating protective layers 24 has a plurality of openings 240 for exposing the circuit layers 211, 213, and each of the openings 240 on the first side 21a of the circuit board 2a is connected to each of the blind vias 220.

Figure 2H:
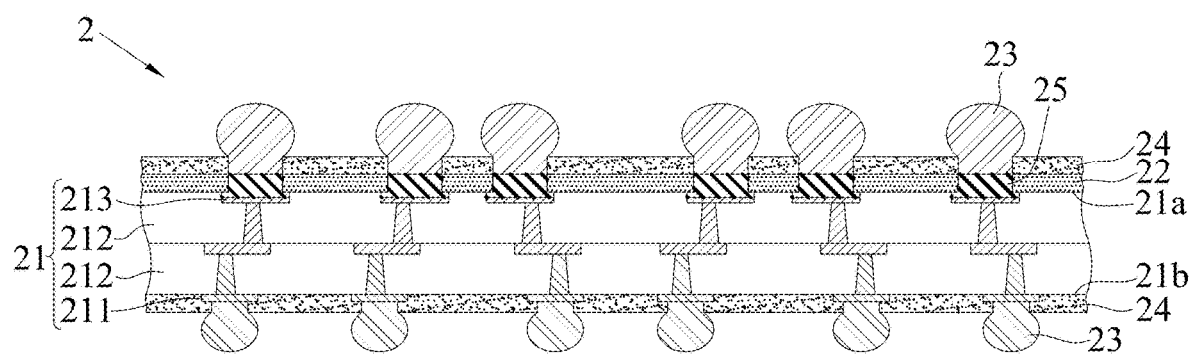

As shown in FIG. 2H, a plurality of conductors 25 are formed in the blind vias 220 of the second dielectric layer 22 and in the grooves 210 of the circuit structure 21, and the conductors 25 are electrically connected to the circuit layer 213 on the first side 21a of the circuit structure 21.

In an embodiment, the conductors 25 are metal bumps such as copper bumps, and the conductors 25 are not formed in the openings 240, so a plurality of conductive elements 23 such as solder bumps can be bonded to the conductors 25. Similarly, conductive elements 23 such as solder balls can also be disposed on the circuit layer 211 in the openings 240 on the second side 21b of the package substrate 2, so that the conductive elements 23 are electrically connected to the circuit layer 211. It should be understood that since the circuit layer 211 of the second side 21b is formed on the first dielectric layer 212, the depth of the openings 240 of the first side 21a is greater than the depth of the openings 240 of the second side 21b.

In addition, in subsequent processes, the package substrate 2 may be connected to at least one electronic component or circuit board via the conductive elements 23. For example, the electronic component is an active component, a passive component, or a combination of the active component and the passive component, wherein the active component is, for example, a semiconductor chip, and the passive component is, for example, a resistor, a capacitor, or an inductor. Preferably, a thickness of the insulating protective layer 24 on the first side 21a of the circuit board 2a is equal to a thickness of the insulating protective layer 24 on the second side 21b of the circuit board 2a, and the number of the openings 240 on the first side 21a is greater and the density is higher comparing to the openings 240 on the second side 21b, so that the conductive elements 23 on the first side 21a are connected to the electronic component, and the conductive elements 23 on the second side 21b are connected to the circuit board.

Therefore, the fabricating method of the present disclosure mainly utilizes thermal release films as the carrier 9 and the support member 8 to form relevant structures on two opposite sides of the thermal release films, which is beneficial to mass production, and can save 70% of production costs comparing to conventional temporary carrier board.

Furthermore, grooves 210 with a very shallow depth R are formed in the circuit structure 21 so the signal transmission of the conductors 25 is better. Also, the thinner circuit layer 213 is embedded in the first dielectric layer 212 on the first side 21a of the circuit structure 21, so the conductors 25 are embedded in the grooves 210 to strengthen the bonding force of the conductors 25, and the reliability of the package substrate 2 is improved, which is beneficial to mass production.

In addition, the thicknesses d1 and d2 of layers (i.e., the first dielectric layer 212 and the second dielectric layer 22) of the package substrate 2 are different to distribute stress, and prevent large stress difference between the first side 21a and the second side 21b of the circuit structure 21, thereby preventing the package substrate 2 from warpage problems. Therefore, comparing to the prior art, when the package substrate 2 undergoes multiple manufacturing processes with environmental temperature variation, deformation and warpage can be effectively prevented from occurring to the package substrate 2, and problems such as detachment or crack can be prevented from occurring to the conductive elements 23.

In other words, by methods such as thermal release films, build-up process and detach layers 81, 92, the fabricating method of the present disclosure is optimized and can overcome the problems of warpage and the depth R of the grooves 210 can be miniaturized as well.

In addition, forming a thinner circuit layer 213 on the first side 21a of the circuit structure 21 can reduce a height of the conductive elements 23 that protrudes from the insulating protective layer 24, thereby meeting requirement of thinning.

The present disclosure also provides a package substrate 2, which comprises: a coreless type circuit structure 21, a second dielectric layer 22 and a plurality of conductors 25.

The circuit structure 21 has a first side 21a and a second side 21b opposing the first side 21a, wherein the circuit structure 21 includes at least a first dielectric layer 212 and a circuit layer 211, 213 formed on the first dielectric layer 212.

The second dielectric layer 22 is formed on the first side 21a of the circuit structure 21, wherein the thickness d2 of the second dielectric layer 22 is less than the thickness d1 of the first dielectric layer 212.

The conductors 25 are embedded in the second dielectric layer 22 and electrically connected to the circuit layer 213 on the first side 21a of the circuit structure 21.

In an embodiment, the circuit layer 213 on the first side 21a of the circuit structure 21 is embedded in the first dielectric layer 212 on the first side 21a of the circuit structure 21.

In an embodiment, the circuit layer 213 on the first side 21a of the circuit structure 21 is recessed into a surface of the first dielectric layer 212 on the first side 21a of the circuit structure 21 to form a plurality of grooves 210, so that the conductors 25 are disposed in the grooves 210.

In an embodiment, the first dielectric layer 212 and the second dielectric layer 22 are made of the same material.

In an embodiment, the package substrate 2 further comprises an insulating protective layer 24 bonded to the second dielectric layer 22, wherein a plurality of openings 240 for exposing the conductors 25 are formed in the insulating protective layer 24 and penetrate through the insulating protective layer 24, and conductive elements 23 are disposed in the openings 240 and bonded to the conductors 25.

In summary, by methods such as thermal release films, build-up process and detach layers, the package substrate and fabricating method thereof of the present disclosure is optimized and can overcome the problems of warpage.

In addition, forming a thinner circuit layer on the first side of the circuit structure can reduce a height of the conductive elements that protrudes from the insulating protective layer, thereby meeting requirement of thinning.

The above embodiments are used to exemplarily illustrate the principles and effects of the present disclosure, but are not used to limit the present disclosure. Anyone skilled in the art may perform modifications to the above embodiments without departing from the spirit and scope of the present disclosure. Therefore, the scope claimed of the present disclosure should be defined by the following claims.

What is claimed is:

1. A package substrate, comprising:
  a circuit structure having a first side and a second side opposing the first side, wherein the circuit structure comprises at least two first dielectric layers and a plurality of circuit layers formed on each of the at least two first dielectric layers,
    wherein the at least two first dielectric layers comprise a third dielectric layer closest to the first side and a fourth dielectric layer closest to the second side;
  a second dielectric layer formed on the third dielectric layer of the at least two first dielectric layers, wherein a thickness of the second dielectric layer is less than a thickness of the at least two first dielectric layers; and a plurality of conductors embedded in the second dielectric layer and electrically connected to the plurality of circuit layers on the third dielectric layer of the at least two first dielectric layers, wherein the plurality of circuit layers on the third dielectric layer of the at least two first dielectric layers is recessed into a surface of the third dielectric layer of the at least two first dielectric layers bonded to the second dielectric layer and embedded in the third dielectric layer of the at least two first dielectric layers to form grooves, and the plurality of conductors are extended into the grooves;

a first insulating protective layer formed on the second dielectric layer, wherein first openings are formed on the first insulating protective layer, and one or more conductive elements are formed in the first openings and bonded to the plurality of conductors;

a second insulating protective layer formed on the fourth dielectric layer of the at least two first dielectric layers, wherein the plurality of circuit layers on the fourth dielectric layer of the at least two first dielectric layers protrudes into a surface of the second insulating protective layer bonded to the fourth dielectric layer of the at least two first dielectric layers and embedded in the second insulating protective layer, and second openings are formed on the second insulating protective layer, and the one or more conductive elements are formed in the second openings and electrically connected to the plurality of circuit layers on the fourth dielectric layer of the at least two first dielectric layers.

2. The package substrate of claim 1, wherein the at least two first dielectric layers and the second dielectric layer are made of the same material.

* * * * *